(12) United States Patent
Schlenker et al.

(10) Patent No.: US 9,130,189 B2
(45) Date of Patent: *Sep. 8, 2015

(54) OPTOELECTRONIC COMPONENT AND METHOD FOR THE PRODUCTION THEREOF

(71) Applicants: Tilman Schlenker, Nittendorf (DE); Ralph Paetzold, Roth (DE)

(72) Inventors: Tilman Schlenker, Nittendorf (DE); Ralph Paetzold, Roth (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 14/152,608

(22) Filed: Jan. 10, 2014

(65) Prior Publication Data

US 2014/0117345 A1     May 1, 2014

Related U.S. Application Data

(63) Continuation of application No. 13/318,341, filed as application No. PCT/EP2010/055289 on Apr. 21, 2010, now Pat. No. 8,680,563.

(30) Foreign Application Priority Data

Apr. 30, 2009    (DE) .......................... 10 2009 019 520
May 27, 2009    (DE) .......................... 10 2009 022 900

(51) Int. Cl.
*H01L 33/00*        (2010.01)
*H01L 51/52*        (2006.01)
(Continued)

(52) U.S. Cl.
CPC ...... *H01L 51/5203* (2013.01); *H01L 21/02172* (2013.01); *H01L 31/0224* (2013.01); *H01L 33/36* (2013.01); *H01L 51/0525* (2013.01); *H01L 51/422* (2013.01);
(Continued)

(58) Field of Classification Search
CPC ............ H01L 51/5221; H01L 51/5056; H01L 51/5206; H01L 51/5068; H01L 51/5218
See application file for complete search history.

(56) References Cited

U.S. PATENT DOCUMENTS 6,576,053 B1    6/2003   Kim et al.
8,680,563 B2 *   3/2014   Schlenker et al. .............. 257/99
(Continued)

FOREIGN PATENT DOCUMENTS

DE       100 49 257       4/2001
DE       697 10 781       10/2002
(Continued)

OTHER PUBLICATIONS

Z.B. Deng et al., "Enhanced brightness and efficiency in organic electroluminescent devices using $SiO_2$ buffer layers", Applied Physics Letters, vol. 76, No. 19, pp. 2227-2229, 1999.

*Primary Examiner* — Victor A Mandala
(74) *Attorney, Agent, or Firm* — Cozen O'Connor (57) ABSTRACT

An optoelectronic component having a substrate (1), an anode (2) and a cathode (10) and at least one active layer (6) disposed between the anode and the cathode. An amorphous dielectric layer (3) which contains or consists of a metal oxide, a metal nitride or a metal oxynitride is disposed directly on the cathode-side surface of the anode. The metal contained in the metal oxide, metal nitride or metal oxynitride is selected from one or several of the metals of the group consisting of aluminum, gallium, titanium, zirconium, hafnium, tantalum, lanthanum and zinc.

17 Claims, 2 Drawing Sheets

(51) Int. Cl.
| | |
|---|---|
| *H01L 51/05* | (2006.01) |
| *H01L 51/42* | (2006.01) |
| *H05B 33/22* | (2006.01) |
| *H01L 21/02* | (2006.01) |
| *H01L 31/0224* | (2006.01) |
| *H01L 33/36* | (2010.01) |
| *H01L 51/10* | (2006.01) |
| *H01L 51/44* | (2006.01) |
| *H01L 51/50* | (2006.01) |

(52) U.S. Cl.
CPC ............ *H01L 51/5206* (2013.01); *H05B 33/22* (2013.01); *H01L 51/10* (2013.01); *H01L 51/448* (2013.01); *H01L 51/5088* (2013.01); *H01L 51/5096* (2013.01); *H01L 51/5237* (2013.01); *Y02E 10/549* (2013.01)

(56) References Cited

U.S. PATENT DOCUMENTS

| | | | |
|---|---|---|---|
| 2001/0031379 A1 | 10/2001 | Tera et al. | |
| 2005/0225234 A1 | 10/2005 | Tyan et al. | |
| 2008/0100202 A1* | 5/2008 | Cok | 313/503 |
| 2008/0136320 A1 | 6/2008 | Choi | |
| 2013/0328030 A1* | 12/2013 | Matsuura et al. | 257/40 |

FOREIGN PATENT DOCUMENTS

| | | | | |
|---|---|---|---|---|
| JP | 08-288069 | * | 11/1996 | 51/50 |
| JP | 11-224781 | * | 8/1999 | 33/22 |
| JP | 2001-284042 | | 10/2001 | |
| JP | 2002-208479 | | 7/2002 | |
| JP | 2004-535038 | * | 11/2004 | 29/16 |
| JP | 2008-291263 | * | 12/2008 | 51/50 |
| WO | WO 98/05187 | | 2/1998 | |
| WO | WO 02/093662 | | 11/2002 | |
| WO | WO 2005/101540 | | 10/2005 | |
| WO | WO 2005/106987 | | 11/2005 | |
| WO | WO 2006/014591 | | 2/2006 | |
| WO | WO 2007/079498 | | 7/2007 | |
| WO | WO 2007/112038 | | 10/2007 | |
| WO | WO 2008/057180 | | 5/2008 | |
| WO | WO 2008/140644 | | 11/2008 | |
| WO | WO 2009/002892 | | 12/2008 | |
| WO | WO 2009/095006 | | 8/2009 | |

\* cited by examiner

OPTOELECTRONIC COMPONENT AND METHOD FOR THE PRODUCTION THEREOF

CROSS REFERENCE TO RELATED APPLICATIONS

This application is a continuation of U.S. patent application Ser. No. 13/318,341 which was filed with the U.S. Patent and Trademark Office on Feb. 2, 2012, now U.S. Pat. No. 8,680,563 which is a U.S. national stage of application No. PCT/EP2010/055289, filed on Apr. 21, 2010. This application claims the priority of German application nos. 10 2009 019 520.3 filed Apr. 30, 2009 and DE 10 2009 022 900.0 filed Apr. 27, 2009, the entire contents of both of which are hereby incorporated by reference.

BACKGROUND OF THE INVENTION

1. Field of the Invention

The invention relates to an optoelectronic component, in particular an organic optoelectronic component, in which an amorphous dielectric layer is disposed on the anode.

2. Description of the Related Art

The efficiency and operating life of optoelectronic components, such as e.g. light-emitting diodes, infrared-emitting light-emitting diodes, organic light-emitting diodes (OLEDs), organic solar cells or organic photodetectors having functional layers can be greatly reduced by the occurrence of a short-circuit.

SUMMARY OF THE INVENTION

An object of the invention is to provide an optical component, in which susceptibility to short-circuits can be reduced.

An optoelectronic component in accordance with an aspect of the present invention comprises a substrate, an anode and a cathode and at least one active layer disposed between the anode and the cathode, e.g. an emitter layer. Furthermore, an amorphous dielectric layer is disposed directly on the cathode-side surface of the anode. This layer contains a metal oxide, a metal nitride and/or a metal oxynitride or consists thereof; the metal contained in the metal oxide, metal nitride or metal oxynitride is selected from one or several of the metals of the group consisting of aluminium, gallium, titanium, zirconium, hafnium, tantalum, lanthanum and zinc.

A layer or an element which is disposed "on" another layer or another element signifies in this case and hereinafter that the one layer or the one element is disposed immediately in direct mechanical and/or electrical contact (i.e. directly) on the other layer or the other element. Furthermore, it can also mean that the one layer or the one element is disposed on the other layer or the other element. Further layers and/or elements can then be disposed between the one or other layer or between the one or other element.

The fact that a layer or an element is disposed "between" two other layers or elements can signify in this case and hereinafter that the one layer or the one element is disposed immediately in direct mechanical and/or electrical contact or in indirect contact with one of the two other layers or with one of the two other elements and in direct mechanical and/or electrical contact with the other of the two other layers or with the other of the two other elements. In the case of indirect contact, further layers and/or elements can then be disposed between the one layer and at least one of the two other layers or between the one element and at least one of the two other elements.

An "amorphous" layer is understood to be a layer, in which no sharp Bragg reflexes (or signals) are obtained by means of X-ray diffraction (XRD). In particular, a maximum of four, typically a maximum of three, parallel lattice planes are present in the regions with short-range order in this amorphous layer. In particular, an amorphous layer is thus understood to be a layer, in which the "crystallites" have a maximum diameter of 2.5 nm. Furthermore, an amorphous material in terms of the present invention is generally also characterised by the fact that the density of this amorphous material is at least ten percent, frequently at least 15 percent and often also more than 20 percent less than that of the corresponding completely crystalline, naturally occurring material (in the case of several modifications of the naturally occurring modification with the highest density). For example, corundum has a density of 3.99 g/cm$^3$ and amorphous aluminium oxide in terms of the present inventions has a density of about 2.8 to 3.4 g/cm$^3$, frequently 2.8 to 3 g/cm$^3$. The density of the amorphous layer can be determined in this case by means of X-ray reflectometry (XRR).

In accordance with an embodiment of the invention, an amorphous dielectric layer can further be understood to be a layer, in which only the surface on one or both main sides of the layer (namely the side of the dielectric layer facing towards the anode or emitter layer) is completely amorphous in terms of the present invention. This can be demonstrated by means of angle-dependent X-ray photoelectron spectroscopy (XPS) (in this case, there are also no sharp signals for the near-surface regions).

The optoelectronic component in accordance with an embodiment of the invention having a dielectric layer is characterised by the fact that the dielectric layer ensures that a considerably lower frequency of short-circuits is observed and the current efficiency is increased. In contrast to a non-amorphous dielectric layer, the use of an amorphous dielectric layer has the advantage that no grain boundaries can form in the layer in the vertical direction; in accordance with the invention it has been recognised that consequently a considerable reduction in the frequency of short circuits is observed once again.

If the optoelectronic component in accordance with the invention is an organic light-emitting diode, then the reduced number of short-circuits can also be recognised by the appearance of the OLED. In comparison to an OLED which is constructed in an identical manner but does not comprise a dielectric amorphous layer, the OLED in accordance with the invention has a significantly more homogeneous transparency; the number of "black spots" is also considerably reduced in comparison with that in the comparative OLEDs and is generally equal to zero. In this case, "black spots" are understood to be regions which are visible to the naked eye (and in which the maximum diameter is greater than or equal to 50 μm).

The material of the amorphous dielectric layer is a metal oxide, a metal nitride or metal oxynitride, wherein the metal can be aluminium, gallium, titanium, zirconium, hafnium, tantalum, lanthanum and/or zinc. These compounds generally have the formula $M_mE_n$, wherein M is the metal, E is oxygen and/or nitrogen and m and n are integers. In this case, the metal is provided in particular in the oxidation state II (zinc), III (aluminium, gallium, lanthanum), IV (titanium, zirconium, hafnium) or V (tantalum); the (formal) proportion of the metal in other oxidation states is a maximum of 2 atom-% and is mostly less than 0.5 atom-% and is frequently equal to zero. The specific indices m and n are thus derived from the valency of 2 for oxygen and 3 for nitrogen; for example, the formulae MO, $M_2O_3$, $MO_2$ and $M_2O_5$ result (in the sequence of the above-described oxidation states for oxides). The aforementioned compounds can also have a certain non-stoichiometry; however (corresponding to the metal atoms in oxidation states other than those stated) the deviation with respect to the integral index is generally a maximum of 2 percent (in the case of a compound of the $M_2O_5$, the non-stoichiometry should not be greater than in the case of the compound $M_{1.96}O_5$). However, the compounds above should preferably not have any non-stoichiometry, since the dielectric constant of non-stoichiometric compounds increases with respect to the corresponding stoichiometric compounds, and furthermore to the extent of the non-stoichiometry. However, materials having higher dielectric constants are less suitable in preventing short-circuits.

In one embodiment, the optoelectronic component in accordance with the invention comprises a hole injection layer which is disposed directly on the dielectric layer (and furthermore on the side remote from the anode) and has a thickness of in particular less than or equal to 5 nm. Typically, the thickness of the hole injection layer is at least 1 nm; frequently the thickness of this layer is 1 to 2 nm.

Therefore, in comparison with identical components in accordance with the prior art which do not comprise a dielectric layer, the thickness of the hole injection layer can be reduced considerably. In accordance with the invention it has been recognised that the current efficiency remains substantially the same and the homogeneity of the transparency also remains the same. In accordance with the prior art—in order to obviate short-circuits—hole injection layers having a thickness of 400 nm or greater are frequently used. Therefore, the thickness of the hole injection layer used in accordance with the invention is typically reduced by at least 90 percent, frequently by at least 95 percent and often even by at least 97.5 percent in comparison with a hole injection layer in a comparable optoelectronic component in accordance with the prior art. Therefore, in accordance with such an embodiment it is possible to achieve an enormous saving in terms of materials. Moreover, the total thickness of the optoelectronic component can be reduced considerably.

In a further embodiment, the dielectric layer contained in the optoelectronic component has a thickness of 0.1 to 100 nm. For the most part, a thickness of 0.1 to 3 nm, in particular of 0.1 to 1 nm, e.g. 0.5 to 1 nm, is expedient.

A particularly small thickness of the dielectric layer generally results in better current efficiency than a thick dielectric layer, since the tunnel probability for the formed holes is then considerably higher. The light density is greater in very thin layers than in thick layers. Typically, the light density of an optoelectronic component in accordance with the invention which is formed as an OLED is at least 1000 cd/m$^2$, mostly even more than 3000 cd/m$^2$. In the event of a current density of 10 to 200 mA/cm$^2$, the efficiency of the light density is generally about 5 to 10 cd/A.

However, the homogeneity of the layer thickness which can be achieved by the method, by means of which the layer is applied, is also decisive for the thickness of the dielectric layer. In order to be able to achieve an efficient protective effect to prevent short-circuits, the layer should cover where possible the entire surface of the anode and should not comprise any gaps. The homogeneity of the layer is thus not only dependent upon the application method for the dielectric layer—the surface quality of the underlying anode also plays a role. If this surface comprises pores or undercuts, then preferably a method is to be selected in which the pore surface is also completely covered by the dielectric layer or the pores are filled thereby and in which in the case of undercuts no gaps appear in the dielectric layer.

In order to be able to achieve this, layer thicknesses of 5 to 15 nm or even larger layers thicknesses may be required depending upon the method used.

In one embodiment, the dielectric layer of the optoelectronic component consists of or contains aluminium oxide.

A layer of this type can be applied in a particularly convenient manner and the starting materials which are to be used are inexpensive. Moreover, aluminium oxide has a particularly low dielectric constant.

In a further embodiment the anode comprises a transparent oxide, in particular indium tin oxide. Transparent conductive oxides (or "TCO" for short) are transparent conductive materials, in general metal oxides, such as e.g. zinc oxide, tin oxide, cadmium oxide, titanium oxide, indium oxide or indium tin oxide (ITO). In addition to binary metal oxygen compounds, such as ZnO, $SnO_2$ or $In_2O_3$, ternary metal oxygen compounds, such as $Zn_2SnO_4$, CdSnO3, $ZnSnO_3$, $MgIn_2O_4$, $GaInO_3$, $Zn_2In_2O_5$ or $In_4Sn_3O_{12}$ or mixtures of different transparent conductive oxides also belong to the group of TCOs. Furthermore, the TCOs do not correspond compulsorily to a stoichiometric composition and can also be p-doped or n-doped. If a TCO is used as an anode material, the dielectric layer can be applied in a particularly convenient manner. Moreover—if radiation is emitted on the anode side—a particularly high level of transparency of the optoelectronic component can be achieved. Alternatively, the anode can also comprise a metal, in particular can comprise, or consist of, a metal layer. The material of this type of electrode can then be selected from one or several of the metals of the group of aluminium, barium, indium, silver, gold, magnesium, calcium and lithium and compounds, in particular alloys, thereof. In a further embodiment, the homogeneity of the layer thickness is independent of the surface structure of the layers directly adjoining the dielectric layer, in particular the layer, onto which the dielectric layer is applied, in particular independent of the surface structure of the anode of the optoelectronic component. In particular, the dielectric layer can thus be formed such that it can follow the surface structure of the anode at least partially or approximately, which means in particular that the cathode-side surface of the dielectric layer partially or approximately follows the topographical structure of the boundary surface between the dielectric layer and the anode (and the surface of the dielectric layer quasi reproduces the surface of the anode).

The fact that the cathode-side surface of the dielectric layer at least partially follows the boundary surface between the anode and the dielectric layer and thus the surface structure of the anode, means in particular in accordance with the invention that the cathode-side surface of the dielectric layer likewise comprises a topographical surface structure. The topographical surface structure of the cathode-side surface of the dielectric layer can be in particular identical or similar to the topographical surface structure of the surface of the anode facing towards the cathode. In this case, the terms "identical" or "similar" mean that the respective topographical surface structures of the sides of the anode and the dielectric layer facing towards the cathode comprise identical or similar height profiles with mutually corresponding structures such as elevations and depressions. For example, these topographical surface structures can each comprise elevations and depressions, which are disposed laterally next to each other, in a specific characteristic sequence which, apart from relative height differences of the elevations and depressions, are identical for the said topographical surface structures. In other words, a surface which at least partially follows the topographical surface structure of another face can comprise an elevation, disposed above an elevation, or a depression disposed above a depression of the topographical surface structure of the surface of the respectively adjacent layer. The relative height difference between adjacent elevations and depressions of the one surface can also be different to the relative height difference of the corresponding elevations and depressions of the topographical surface structure of the other face—however, this relative height difference is also frequently approximately the same.

If the surface structure of the anode comprises pores and/or undercuts, the terms "identical" or "similar" are understood to be mean that the side of the dielectric layer facing towards the cathode does not have to (but can) emulate these pores and/or undercuts. As explained above, in terms of the present invention it is sufficient, if it is ensured that in the case of such structural elements no "gaps" are formed in the dielectric layer and a layer which completely covers the anode is obtained.

In other words, the phrase "partially or approximately follow" can mean in particular that the upper surface of the dielectric layer and the boundary surface between the dielectric layer and the anode extend in parallel or at least approximately in parallel. Therefore, the dielectric layer can comprise in particular a thickness which is independent or approximately independent of the surface structure of the anode.

Therefore, the layer thickness of the dielectric layer can have in particular a thickness variation of a maximum of 10 percent, frequently less than or equal to 5 percent when measured against the total thickness of the dielectric layer. This type of formation of the dielectric layer having such a low thickness variation can also be defined as a so-called "conformal coating".

However, the thickness variation of the dielectric layer can naturally also be greater in the case of very thin layers (in particular if the layer is only up to 10 atomic layers thick or is up to 1 nm thick). In the case of such thin layers, the thickness variation is then ±2 atomic layers (generally even ±1 atomic layer).

Furthermore, the dielectric layer can have a thickness which is less than the dimensions of at least some structures and in particular macroscopic structures of the surface structure of the anode. In this case, the macroscopic structures are ascribed structures of the surface structure which can be resolved by means of visible light (and can comprise some pitches, elevations, angles, edges, corners, depressions, trenches, furrows, pores or the like). In particular, this means that in this case structures defined as macroscopic have dimensions of greater than or equal to about 400 nm. Smaller structures are defined as microscopic structures. In particular, the dielectric layer can follow the microscopic structures of the surface structure of the anode, the dimensions of which are greater than the thickness of the dielectric layer.

The thickness of the dielectric layer can also be independent of pores in the surface of the anode facing towards the cathode. In particular, if the diameter of the pores (in the case of bottle-like pores etc. the smallest diameter of the pores) is greater than the double layer thickness of the dielectric layer, the pore surface can also be provided in a uniform manner and in the above sense at least virtually with an identical layer thickness of the dielectric layer, in which the dielectric layer follows the surface structure of the anode. If the layer thickness of the dielectric layer is greater than half the diameter of these pores, the dielectric layer will cover the pores without following the surface structure of these pores, and will still have a thickness which in the above sense remains at least virtually constant. The average roughness Ra of TCO-anodes, in particular ITO-anodes, is typically less than or equal to 1.5 nm and is generally less than 2.5 nm.

A method which renders it possible to apply dielectric layers which comply with the conditions stated above is atomic layer deposition (ALD).

By means of a method of this kind, individual atomic layers are deposited successively one after the other which means that the layer thickness of the formed layer remains substantially identical, since the deposited atomic layers (in particular with a suitable selection of the precursor—in particular in the selection of a precursor which in sterical terms is not especially sophisticated) essentially completely cover the underlying atomic layer or the underlying surface which is to be coated. The layers which are produced by means of ALD have the advantage that they also completely cover undercuts and pore surfaces, since the layer formation is independent of the deposition direction (this means that the deposited material—or the precursor—does not influence the surface, which is to be coated, from a preferential direction or a preferential spatial segment—as is the case e.g. with sputtering). In general, methods of applying the dielectric layer, in which the layer formation in pores and undercuts is independent of the application method, are thus preferred in accordance with the invention.

In a further embodiment, the atomic layer deposition is performed without plasma. This results in a particularly homogeneous layer thickness of the formed dielectric layer. Whereas in the case of plasma-assisted atomic layer deposition a reaction of the precursor with the plasma cannot be ruled out (which can result in a reaction even in the gas phase and therefore in the formation of monolayers which are not completely uniform), this is not the case with plasma-free ALD. In particular, in the case of very thin layer thicknesses of 0.1 to 0.5 nm, plasma-free ALD thus generally produces the better result; in general in the case of such layer thicknesses complete coverage of the anode surface and a somewhat uniform layer thickness can only be achieved by plasma-free ALD.

A dielectric layer which is produced by means of atomic layer deposition is also characterised in particular by virtue of the fact that it is typically free or substantially free of gas inclusions. In particular, no gas inclusions are acquired which are attributable to a carrier gas used in layer deposition. In the case of sputter processes for applying the layer, such inclusions are always found (e.g. inclusions of argon as the carrier gas). At best, gas inclusions which are traced back to the precursor material used (e.g. methane) are conceivable. However, in the case of plasma-free ALD the successive deposition of the atomic layers ensures that such inclusions are generally not found. It is only in plasma-assisted ALD that there is certain tendency towards the formation of gas inclusions (which, however, is dependent upon the specific deposition conditions).

Atomic layer deposition is performed in particular as follows:

A substrate having an electrode layer, which is to be coated, disposed thereon is initially fed to a reactor, in which the ALD is performed. The substrate or the reactor is then subjected to an absorption pulse (method step B1). In this case, either a precursor or an oxidising agent (or a reducing agent instead of an oxidising agent) is fed to the reactor. An oxidising agent is required if oxidation of the precursor or of a component of the precursor is required, in order to obtain a layer of the desired composition (e.g. in the production of metal oxide layers); a reducing agent is required if a reduction of the precursor or of a component of the precursor is required, in order to obtain the layer to be formed or the layer to be formed contains a component (e.g. a nitride component) which, by means of the reaction with the reducing agent, "is transmitted to the precursor metal" (e.g. during the formation of the metal nitrides with e.g. ammonia as the precursor). The precursor or the oxidising or reducing agent is fed to the reactor typically in gaseous form. During the absorption pulse, the precursor or the oxidising or reducing agent can then adsorb on the surface which is to be coated. In general, the surface is completely or at least almost completely covered by this gaseous compound. If a precursor is used with particularly bulky substituents (e.g. a metal-alkyl compound with alkyl radicals each with 3 or more C-atoms), then complete coverage of the surface (which then results in a complete atomic layer upon completion of the respective ALD-cycle) is not guaranteed in each case. Therefore, it is for the most part expedient to use precursors which comprise less bulky substituents, since then a "denser packing" is provided in the absorbed atomic layer. The above statements relating to the precursor also apply if the precursor is only supplied in a reaction pulse described hereinafter.

After the absorption pulse, a purging and/or evacuation step (method step B2) is preformed in the reactor. As a result, molecules which have not been absorbed on the surface to be coated are substantially removed from the reactor. The purging gas used can be an inert gas (e.g. argon). The purging and/or evacuation step is generally conducted in such a manner that a certain constant purging gas stream flows through the reactor and the pressure ratios prevailing prior to the implementation of the adsorption pulse are then built up successively.

A reaction pulse is then effected (method step B3), in which the substrate having the absorbed precursor is subjected to an oxidising agent (or to a reducing agent) or—if it is not the precursor but rather the oxidising agent (or the reducing agent) which is absorbed on the substrate—the substrate is subjected to a precursor. The supply of the second reaction component in the reaction pulse can bring about a reaction of the precursor and oxidising agent or of the precursor and reducing agent, whereby a monolayer of the metal oxide or metal nitride or metal oxynitride (of the dielectric layer of the present invention) is formed. For this purpose, the surface which is to be coated or even the reactor can optionally be heated in order to enable thermal support of the reaction of the precursor and oxidising or reducing agent.

In general, after a reaction pulse has been effected a further purging and/or evacuation step (method step B4) is performed, in order to remove excess molecules of the component, which is supplied during the reaction pulse, from the reactor.

In order to achieve the desired layer which is produced by means of ALD, the absorption pulse, purging/evacuation step, reaction pulse and second purging/evacuation step are repeated consecutively in the stated sequence until the desired number of atomic layers is deposited (or the desired layer thickness is achieved).

In one embodiment, the ALD-process is conducted in such a manner that the layer deposition (method step B) or the multiple repetition of method steps B1, B2, B3 and B4 is conducted at a temperature of at least $60^2$C and/or a pressure of no greater than 50 mbar. If the process parameters are selected in this manner, on the one hand this ensures that the absorption effected in method step B2 (absorption pulse) actually results in a monolayer and on the other hand a complete reaction is effected in method step B3 (reaction pulse). Furthermore, the low pressure (and optionally also the elevated temperature) can ensure that the precursors or oxidising or reducing agents which are used are present in gaseous form.

In one embodiment, the temperature in method step B) amounts to 80 to 260° C. In a reaction window of this type it is ensured that no damage occurs to a more sensitive surface which is to be coated. If an organic layer (e.g. a hole injection layer) is present as the surface which is to be coated, the reaction temperature should not exceed 100° C. and should preferably be 80 to 100° C., in order to prevent damage to this layer.

In a preferred manner, method step B is conducted at a pressure of no greater than 5 mbar, for the most part more than 0.1 mbar. This also ensures that a particularly "densely packed" monolayer can be produced in the absorption pulse.

Possible oxidising agents include in particular water and ozone (but also oxygen or hydrogen peroxide).

The aforementioned oxidising agents can also be present in mixtures (e.g. an $O_2/O_3$ mixture). When water is used as the oxidising agent, the ALD-process is frequently conducted in such a manner that, in the absorption pulse, water is absorbed on the surface which is to be coated; the precursor (e.g. trimethyl aluminium) is then supplied in the reaction pulse. When other oxidising agents are used, the precursor is frequently adsorbed in the adsorption pulse.

In the case of water as the oxidising agent supplied in the absorption pulse, it has been established in accordance with the invention that a monolayer consisting of water can also be applied directly on the surface which is to be coated, without damaging the surface which is to be coated or the component itself. In this regard, it is a prerequisite that the time the water can remains on the surface to be coated, before the second compound is supplied in the reaction pulse, must be less than the diffusion time the water requires to diffuse into the layer which is to be coated. This can frequently be accomplished by ensuring that process steps B1 and B2 do not last longer than 5 s (e.g. not longer than 100 s). The short overall times of in general ca. 10-20 s for one ALD-cycle permit a short process time and thus very high degree of operating efficiency of the method described in this case.

The aforementioned oxidising agents are used in particular for the production of metal oxides.

In particular, ammonia is used as the reducing agent for the method in accordance with the invention. In the absorption pulse, the precursor (e.g. a metal amide) is then often absorbed on the surface and reacts in the reaction pulse with the ammonia, wherein a metal nitride is formed.

In a further embodiment, the precursor used for the ALD-method is a metal alkyl compound, a metal alkoxide compound, a metal dialkylamide compound and/or a metal halide compound. In general, the precursors which are used will support only one type of substituent (i.e., alkyl, alkoxide, dialkylamide or halide); however, mixed systems (which support e.g. a halide or an alkoxide group) can also be used.

For the deposition of aluminium oxide layers, aluminium alkyl compounds (e.g. trimethyl aluminium) or aluminium alkoxide compounds (e.g. aluminium ethoxide) are frequently used. For gallium oxide, gallium alkyl compounds (e.g. trimethyl gallium) or gallium halides (e.g. gallium chloride) are frequently used. For titanium oxides, zirconium oxides and hafnium oxides, the metal halides (e.g. $TiCl_4$, $ZrCl_4$ or $HfCl_4$ or metal alkoxide compounds (e.g. $Ti(OR)_4$, $Zr(OR)_4$ or $Hf(OR)_4$) are frequently used. In order to produce tantalum oxide, tantalum halides (e.g. tantalum chloride) are frequently used and for lanthanum oxides, the corresponding alkoxy or halide compounds are used. Finally, in order to produce zinc oxide layers, the zinc alkyl compounds (e.g.

dimethyl zinc) or the zinc halides (e.g. zinc chloride) are frequently used; however, zinc can also be used in elementary form. In order to produce metal nitrides, the metal dialkylamide compounds of the corresponding elements (e.g. $M_k(N(CH_3)_2)_l$—where k and l are integers) are generally used.

An oxide nitride layer can be deposited e.g. by depositing nitride and oxide layers in alternating fashion.

The substrate of the component is particularly suitable as a carrier element for electronic elements, in particular optoelectronic elements. For example, the substrate can contain or consist of glass, quartz and/or a semiconductor material. Furthermore, the substrate can contain or consist of a synthetic material film or a laminate having one or more synthetic material films. The synthetic material can comprise one or several polyolefins such as polyethylene (PE) of high and low density and polypropylene (PP). Furthermore, the synthetic material can also comprise polyvinylchloride (PVC), polystyrene (PS), polyester and/or preferably polycarbonate (PC), polyethylene terephthalate (PET), polyethersulfone (PES) and/or polyethylene naphthalate (PEN).

Furthermore, the substrate can comprise metal, in particular a metal foil. A substrate which comprises a metal foil or a substrate which is formed as a metal foil can comprise e.g. an aluminium foil, a copper foil, a high-grade steel foil or a combination or layer stack thereof.

The substrate can comprise one or several of the aforementioned materials and can be designed to be transparent, partially transparent or even opaque.

The optoelectronic component in accordance with the invention can comprise in particular an organic light-emitting diode (OLED), an organic photodiode (OPD), an organic solar cell (OSC), an organic thin film transistor (OTFT) or an integrated circuit (IC) or a plurality or combination of the aforementioned elements, or can consist merely of one of these elements.

The component can also comprise a functional layer sequence having at least one organic functional layer. This layer sequence is disposed in particular between the two electrodes.

If the component comprises e.g. an OLED, and OPD and/or an OSC, the functional layer sequence can comprise an active region (e.g. an emitter layer) which is suitable for generating or detecting electromagnetic radiation during operation of the component. Furthermore, the component then frequently comprises a transparent substrate.

Furthermore, the first electrode and/or the second electrode can be transparent and can contain or consist of e.g. a TCO. An electrode having this type of material can be formed in particular as an anode, i.e., as a hole-injecting material.

Furthermore, the first and/or the second electrode can comprise a metal which can be used e.g. as a cathode material, i.e. as an electron-injecting material. In particular, aluminium, barium, indium, silver, gold, magnesium, calcium or lithium and compounds, combinations and alloys thereof can prove to be advantageous as the cathode material. Alternatively or in addition, one or both electrodes can also comprise combinations, in particular layer sequences of TCOs and/or metals.

The at least one functional layer can comprise an organic layer or a layer sequence of several organic functional layers. For example, organic polymers, organic oligomers or organic small, non-polymeric (monomeric) molecules ("small molecules") or combinations of these compound classes can be included in this case or the layers can consist of these compound classes or mixtures thereof.

In particular, it can be advantageous if a component which is designed as an organic electronic component comprises a functional layer which is designed as a hole-transporting layer, in order to permit effective hole-injection into an electroluminescent layer or an electroluminescent region e.g. in the case of an OLED.

Furthermore, the active layer can be designed as an electroluminescent layer. Materials suitable for this purpose include materials which have a radiation emission by reason of fluorescence or phosphorescence, wherein the layer can consist of these materials or contains the emitter materials present in a matrix. In dependence upon the materials in this emitter layer, the generated radiation can comprise wavelength ranges from the ultraviolet spectral range to the red spectral range.

A component which comprises one or several OLEDs can be formed in particular as an illumination device or as a display and can comprise active luminous surface formed over a large area. The term "large area" can means that the component has an area of greater than or equal to several millimeters squared, preferably greater than or equal to one square centimeter and particularly preferably greater than or equal to one square decimeter.

In the case of such large-area luminous surfaces, displays can be produced which even after an operating time of 500 hours also have less than one black spot per centimeter squared.

The said list of embodiments of the component is not to be understood as limiting. On the contrary, the component can comprise further electronic elements and/or functional layer sequences which are known to the person skilled in the art and which therefore are not specified further in this case.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

DETAILED DESCRIPTION OF THE PRESENTLY PREFERRED EMBODIMENTS

Figure 1:
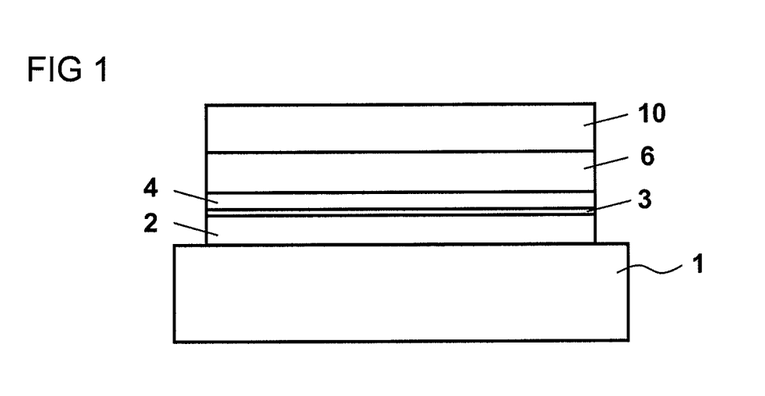
FIGS. 1 and 2 show in each case schematic overviews of one embodiment of an optoelectronic component in accordance with the present invention.

FIG. 1 illustrates the schematic structure of an organic radiation-emitting component. The following layer structure is produced from the bottom upwards: located at the very bottom is the substrate 1 which can be e.g. transparent, e.g. can consist of glass. Located on this is an anode layer 2 which can be e.g. a transparent conductive oxide such as indium tin oxide (ITO) or can comprise same. Disposed above this anode layer 2 is a dielectric layer 3, e.g. consisting of aluminium oxide, above which is disposed in turn a hole-transporting layer 4 which consists of or contains a material which can be selected e.g. from tertiary amines, carbazole derivatives, polyaniline or polyethylenedioxythiophene. By way of example, reference can be made to NPB (N,N[1]-bis(naphtha-1-yl)-N,N'-bis(phenyl)-benzidine and TAPC (Di-[4-(N,N'-ditolyl-amino)-phenyl]cyclohexane). Following on from the hole-transporting layer is the active layer—in the case of an OLED e.g. an organic emitter layer 6. This type of organic emitter layer can contain or consist of an organic or organometallic compound as the emitting material. Reference can be made in particular to derivatives of polyfluorene, polythiophene and polyphenylene (e.g. 2- or 2,5-substituted poly-p-phenylene vinylene) and metal complexes, e.g. iridium complexes such as blue phosphorescent FIrPic (bis(3,5-difluoro-2-(2-pyridyl)phenyl-(2-carboxy pyridyl)-iridium III), green phosphorescent Ir (ppy)$_3$ (tris(2-phenyl pyridine) iridium(III), red phosphorescent Ru (dtb-bpy)$_3$*2(PF$_6$) (tris[4,4'-di-tert-butyl-(2,2')-bipyridine]ruthenium (III) complex) and blue fluorescent DPAVBi (4,4-bis[4-(di-p-tolylamino) styryl] biphenyl), green fluorescent TTPA (9,10-bis[N,N-di-(p-tolyl)-amino]anthracene and red fluorescent DCM2 (4-(dicyanomethylene)-2-methyl-6-julolidyl-9-enyl-4H-pyran) as non-polymeric emitters. Finally, disposed on the emitter layer is a cathode, e.g. a metal cathode or a cathode which is likewise manufactured from a transparent conductive oxide (which results in a top/bottom emitter). The layer thickness of the dielectric layer 3 can in this case amount to e.g. 1.5 nm and the layer thickness of the hole injection layer 4 can amount to e.g. 15 nm.

When a voltage is applied between the anode and the cathode, current flows through the component, and in the organic active layer photons are released which depart from the component in the form of light via the transparent anode and the substrate or in the case of a top/bottom emitter also depart therefrom via the transparent cathode. In one embodiment, the OLED emits white light; in this case the emitter layer contains either several emitter materials which emit different colours (e.g. blue and yellow or blue, green and red; alternatively the emitter layer can also be constructed from several partial layers, in which in each case one of the said colours is emitted, wherein by mixing the different colours the emission of light having a white colour impression results. Alternatively, in the beam path of the primary emission generated by these layers it is also possible to dispose a converter material which at least partially absorbs the primary radiation and emits secondary radiation of a different wavelength, which means that a white colour impression is produced from an (as yet non-white) primary radiation through the combination of primary and secondary radiation.

The component illustrated in FIG. 1 can be produced in particular in that e.g. the anode is initially sputtered onto the substrate and the dielectric layer is then applied by means of ALD. Subsequently, the hole injection layer 4, the active layer (emitter layer) 6 and the cathode are applied.

Figure 2:
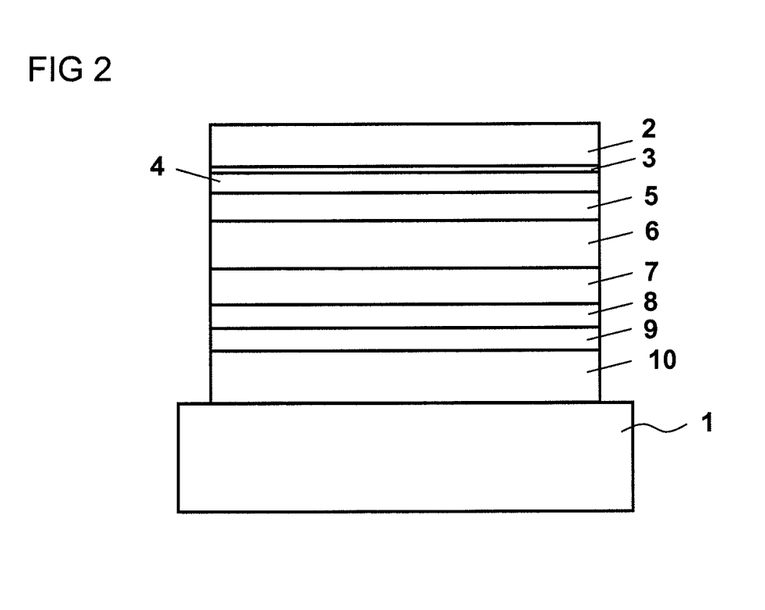

FIG. 2 illustrates an OLED which is formed as a top emitter; if the cathode 10 is transparent then it is a top/bottom emitter.

In this case, a cathode (which is formed e.g. from a metal or—in particular if a transparent electrode is desired—is manufactured from a TCO) is disposed on a substrate 1 (e.g. a glass substrate). Disposed on the cathode is an electron injection layer 9, on which there is located an electron-transporting layer 8. Located on the electron-transporting layer 8 is a hole-blocking layer 7, on which the active layer (an organic emitter layer) 6 is then disposed. This emitter layer can be formed as described in FIG. 1.

A hole-transporting layer 5 which can comprise e.g. TPBi (2,2',2"-(1,3,5-benz-triyl)-tris(1-phenyl-1-H-benzimidazole)) is located on the emitter layer. Located on the hole-transporting layer is, in turn, a thin hole injection layer 4, e.g. having a thickness of 15 nm. Located above the hole injection layer 4 is the dielectric layer 3 (e.g. consisting of aluminium oxide) on which, in turn, the anode (which is formed e.g. from a TCO) is disposed.

An OLED in accordance with FIG. 2 can be manufactured e.g. in that the organic layers 4 to 9 are applied by means of a wet process (e.g. spin coating); this is particularly expedient if the layers which are to be applied contain a polymer. Alternatively, the organic layers can also be applied by means of vapour deposition. For this purpose, the substrate which is to be coated can be introduced with the electrode or the electrode and dielectric layer into a recipient which contains the different organic materials in different sources. In order to produce the individual functional layers, the organic substances are then vaporised from the respective sources and are deposited on the coated surface. Furthermore, several sources for the supply of one or several different matrix materials are provided. For example, in order to form a hole injection layer a source having a matrix material and a source having a p-dopant are deposited. Deposition of the emitter material and the matrix material or various emitter materials and the matrix material for the emitter layer 6 is effected in a collective manner accordingly. Deposition of the further organic layer can take place accordingly. Finally, a mixed deposition is also possible, in which [the] first organic layers are applied by means of spin coating and the further organic layers are applied by means of vaporisation.

In order to produce the component in accordance with FIG. 2, an ITO layer as a cathode (in the case of a top/bottom emitter) can thus initially be applied on a substrate by means of HF-sputtering or an aluminium layer can be applied by means of CVD (chemical vapour deposition). This has the advantage that it acts in a reflective manner, which means that radiation which is emitted in the active layer and is directed in the direction of the substrate is reflected on this reflective electrode and is diverted in the direction of the transparent electrode.

Subsequently, the organic layers 9 to 4 (beginning with the electron injection layer 9 and ending with the hole injection layer 4) are applied to this cathode. A dielectric layer 3 (e.g. consisting of aluminium oxide) is then applied to hole injection layer by means of ALD; in order not to damage the already applied organic layers the ALD-method is thus conducted at a temperature of about 90 to 100° C. Finally, the transparent anode (e.g. consisting of ITO) is applied to this dielectric layer 3 by means of sputtering.

Figure 3:
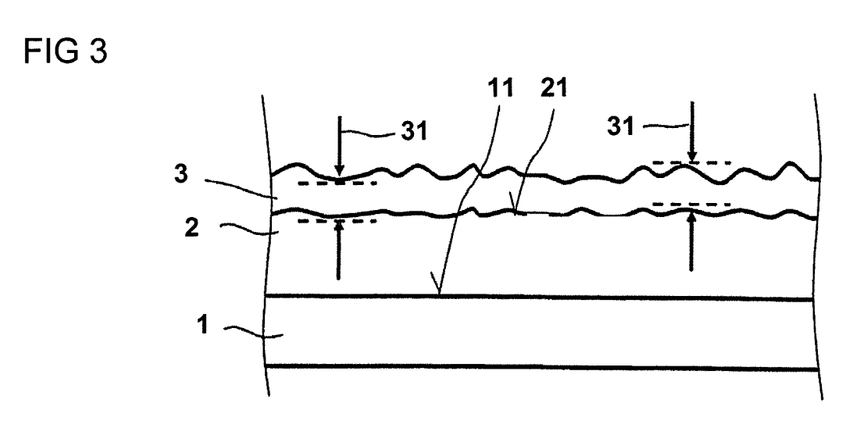
FIG. 3 and FIGS. 4A-4C show schematic illustrations of sections of dielectric layers on an anode layer.

FIG. 3 illustrates a section of an optoelectronic component, which shows the situation after the dielectric layer 3 has been applied to the anode 2. As is evident in FIG. 3, the surface 21 of the anode layer 2, on which the dielectric layer 3 is applied, has a surface structure in the form of a roughness which is caused e.g. by the application method, by means of which the anode layer 2 is applied. Furthermore, impurities on the surface 11 of the substrate 1 during application of the anode layer can result in the surface 21 of the anode layer 2 having a roughness.

In this case, the dielectric layer 3 has a thickness which purely by way of example is designated at two locations by the reference numeral 31. As can be seen in FIG. 3, the dielectric layer 3 follows the surface structure of the surface 21 of the anode layer 2 in the manner described in the general part, which means that the thickness 31 of the dielectric layer 3 is almost independent of the surface structure of the anode layer 2. The thickness variation of the thickness 31 amounts to less than 10 percent. As shown in FIG. 3, the dielectric layer 3 is formed in such a manner that it can at least almost follow the microscopic structures of the surface structure 21 of the anode layer.

Figure 4A:
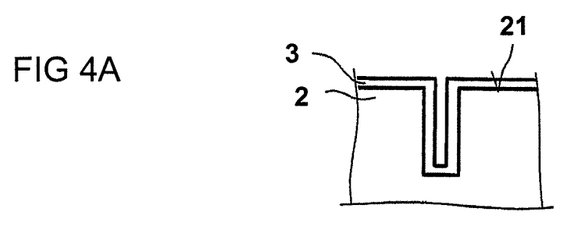
Figure 4B:
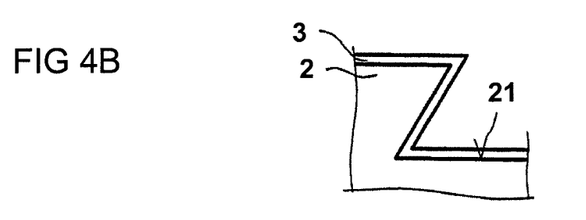
Figure 4C:
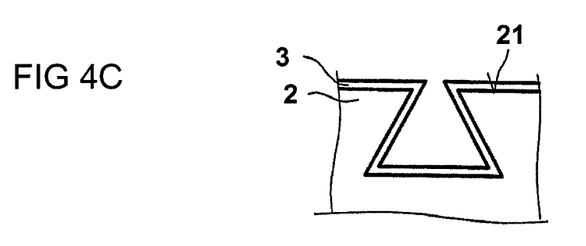

In this connection, FIGS. 4A to 4C illustrate further sections from the surface structure of the anode layer 2 and the dielectric layer 3 of the optoelectronic component in accordance with the invention. In this case, various macroscopic structures are illustrated purely by way of example.

In FIG. 4A, the surface 21 of the dielectric layer 2 comprises a depression which—compared to the diameter—has a considerably greater depth. The dielectric layer 3 follows the surface structure 21 of the anode layer 2 and thus forms, on the entire surface of the opening, a continuous layer having a constant thickness. In this case, the depth-to-diameter ratio of the depression changes.

In FIG. 4B, the anode layer 2 comprises a surface 21 having a protruding partial region, whereas the anode layer 2 in FIG. 4C comprise an opening which widens in a downward direction (in the manner of a bottle pore). In spite of the negative angles for application of the dielectric layer 3 onto such structures in the surface of the anode layer 2, the dielectric layer can be formed with an almost constant thickness as in FIG. 3. By virtue of the fact that the dielectric layer coves the anode uniformly, homogeneously and completely, it is possible—even in the case of undercuts as in FIG. 4B or bottle-like pores as in FIG. 4C—to ensure that electrons are prevented from "penetrating" as far as to the anode, as a result of which the risk of short-circuits is considerably reduced.

The invention is not limited by the description with reference to the exemplified embodiments. On the contrary, the invention comprises each new feature and each combination of features, which includes in particular each combination of features in the claims, even if this feature or this combination itself is not explicitly stated in the claims or exemplified embodiments.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. An optoelectronic component comprising:
   a substrate;
   an anode and a cathode; and
   at least one active layer which is disposed between the anode and the cathode, wherein disposed directly on the cathode-side surface of the anode is an amorphous dielectric layer which has a thickness of 0.1 to 3 nm and contains or consists of a metal oxide, a metal nitride or a metal oxynitride, wherein the metal contained in the metal oxide, metal nitride or metal oxynitride is selected from one or several of the metals of the group consisting of aluminium, gallium, titanium, zirconium, hafnium, tantalum, lanthanum and zinc.

2. The optoelectronic component as claimed in claim 1, wherein the dielectric layer consists of aluminium oxide.

3. The optoelectronic component as claimed in claim 1, wherein the anode comprises a transparent conductive oxide.

4. The optoelectronic component as claimed in claim 1, wherein the homogeneity of the layer thickness of the dielectric layer is independent of the surface structure of the layers directly adjoining the dielectric layer.

5. The optoelectronic component as claimed in claim 1 wherein the thickness variation of the dielectric layer is not greater than 10%.

6. The optoelectronic component as claimed in claim 1, wherein the dielectric layer can be produced by means of atomic layer deposition.

7. The optoelectronic component as claimed in claim 1, which is formed as an OLED.

8. A method of coating an electrode, in particular an anode for an optoelectronic component as claimed in claim 1, having a dielectric layer having a thickness of 0.1 to 3 nm and which contains or consists of a metal oxide, a metal nitride or a metal oxynitride, wherein the metal M is selected from one or several of the metals of the group consisting of aluminium, gallium, titanium, zirconium, hafnium, tantalum, lanthanum and zinc, comprising the steps of:
   A) providing a substrate having an electrode layer disposed thereon and
   B) depositing the dielectric layer by means of atomic layer deposition, so that the electrode layer is completely covered by the dielectric layer.

9. The method as claimed in claim 8, wherein step B) is conducted by means of plasma-free atomic layer deposition.

10. The method as claimed in claim 8, wherein during step B), the following partial steps are successively repeated multiple times in the stated sequence:
    B1) adsorption pulse, in which the substrate is subjected to a precursor or an oxidising agent or reducing agent;
    B2) purging step or evacuation step;
    B3) reaction pulse, in which the substrate having the adsorbed precursor is subjected to an oxidising agent or reducing agent or the substrate having the adsorbed oxidising agent or reducing agent is subjected to a precursor; and
    B4) purging step or evacuation step.

11. The method as claimed in claim 8, wherein step B) is conducted at a temperature of at least 60° C. and at a pressure of no greater than 50 mbar.

12. The method as claimed in claim 8, wherein the oxidizing agent is selected from the group consisting of water, ozone, oxygen, hydrogen peroxide and mixtures of the aforementioned substances.

13. The method as claimed in claim 8, wherein the precursor is a metal alkyl, a metal alkoxide, a metal dialkylamide and/or a metal halide.

14. The optoelectronic component as claimed in claim 4, wherein the transparent conductive oxide is indium tin oxide.

15. The optoelectronic component as claimed in claim 1, wherein the homogeneity of the layer thickness of the dielectric layer is independent of the surface structure of the anode.

16. The optoelectronic component as claimed in claim 1, wherein the dielectric layer can be produced by plasmafree atomic layer deposition.

17. The method as claimed in claim 8, wherein step B) is conducted at a temperature of 80° C. to 260° C., and at a pressure of no greater than 0.1 mbar to 5 mbar.

* * * * *